United States Patent
Hedayat et al.

(10) Patent No.: US 7,640,478 B2
(45) Date of Patent: Dec. 29, 2009

(54) METHOD FOR DECODING TAIL-BITING CONVOLUTIONAL CODES

(75) Inventors: Ahmadreza Hedayat, Plano, TX (US); Hang Jin, Plano, TX (US)

(73) Assignee: Cisco Technology, Inc., San Jose, CA (US)

(*) Notice: Subject to any disclaimer, the term of this patent is extended or adjusted under 35 U.S.C. 154(b) by 658 days.

(21) Appl. No.: 11/408,471

(22) Filed: Apr. 21, 2006

(65) Prior Publication Data

US 2006/0242531 A1    Oct. 26, 2006

Related U.S. Application Data

(60) Provisional application No. 60/674,776, filed on Apr. 26, 2005.

(51) Int. Cl.
*H03M 13/00* (2006.01)

(52) U.S. Cl. ............... 714/755; 714/786; 714/791; 714/795; 714/796; 375/262; 375/265; 375/341

(58) Field of Classification Search ................. 714/755, 714/786, 791–792, 794–796; 375/262, 265, 375/341, 365, 362
See application file for complete search history.

(56) References Cited

U.S. PATENT DOCUMENTS 6,597,743 B1    7/2003  Khayrallah et al. ......... 375/265
6,690,750 B1 *  2/2004  Hocevar et al. ............. 375/341

OTHER PUBLICATIONS

Shao R Y et al., "An Iterative Bidirectional Decoding Algorithm For Tail Biting Codes", Information Theory and Communications Workshop, 1999. Proceedings of the 1999 IEEE Kruger National Park, South Africa Jun. 20-25, 1999, Piscataway, NJ, USA, IEEE, US, Jun. 20, 1999, p. 122.
Rose Y. Shao, Shu Lin, Marc P. C. Fossorier, "Two Decoding Algorithms for Tailbiting Codes", IEEE Trans. Comm., vol. 51, No. 10, Oct. 2003, pp. 1658-1665.
Ma H H et al., "On Tail Biting Convolutional Codes", IEEE Transactions on Communications, IEEE Service Center, Piscataway, NJ, US, vol. Com-34, No. 2, Feb. 1986, pp. 104-111.
R. Y. Shao, Shu Lin, M.P.C. Fossorier, "Decoding of Codes Based on Their Tail Biting Trellises", ISIT, Sorrento, Italy, Jun. 25-30, 2000, p. 342.
Todd K. Moon, "Error Correction Coding", 2005, Wiley, pp. 481-482.
European Search Report dated Apr. 4, 2008 in counterpart European Patent Application No. 06750948.9.

* cited by examiner

*Primary Examiner*—Guy J Lamarre

(57) ABSTRACT

A method for decoding tail-biting convolutional codes is disclosed. In the method, all beginning states of a trellis diagram are initialized. Forward Viterbi metrics are calculated for the trellis diagram. A trace-back process is performed from an ending state of the trellis diagram at a first time instance to a first state where all surviving paths converge at a second time instance. Backward Viterbi metrics are calculated for a predetermined period of time from the first state at the second time instance to a second state at a third time instance. A trace-back process is performed from a designated state, which is equal to the second state, at the first time instance to determine a most likely path for the convolutional codes in the trellis diagram.

20 Claims, 5 Drawing Sheets

METHOD FOR DECODING TAIL-BITING CONVOLUTIONAL CODES

CROSS REFERENCE

The present application claims the benefits of U.S. Patent Provisional Application No. 60/674,776, entitled Low Complexity Decoding of Tail-Biting Convolution Codes, which was filed on Apr. 26, 2005.

FIELD OF THE INVENTION

The present invention relates generally to digital signal communications, and more particularly to a method for decoding tail-biting convolutional codes.

BACKGROUND

Signals passed on a communication channel between a transmitter and a receiver can be affected by noise or interfered by signals on adjacent channels. One objective of channel encoding and decoding is to protect signals against errors caused by noise or interference. Convolutional codes have been used extensively in digital communications in order to incorporate forward error correction into a transmitted message. FIG. 1 illustrates a typical convolutional encoder 100 that includes a first latch 102, a second latch 104, and various adders 106, 108 and 110. The latch 102 receives an input signal from node C, and generates an output signal at node B. The latch 104 receives an input signal from node B, and generates an output signal at node A. The output X equals to the summation of signals at nodes C, B and A. The output Y equals to the summation of signals at nodes C and A. In this example, for each bit arriving at node C, two bits are generated at X and Y. The X and Y bits can be decoded by using a trellis diagram, which is comprised of a set of nodes representing logics states of the latches 102 and 104, and a set of links showing the progression of the logic states as the convolutional encoder 100 continues receiving input signals at node C.

One important issue in decoding convolutional codes is trellis termination. Conventionally, there are two methods to terminate the trellis of convolutional codes. One common method is to force the convolutional encoder to a known state by flushing it with a given input sequence, e.g. series of zero inputs. This approach simplifies the decoder design. However, one drawback of the approach is the rate loss due to these additional tail bits.

Tail biting, which designates the same values to the beginning and ending states of a trellis diagram, is another method typically used for trellis termination. Since tail biting does not require any additional bits, it does not have the rate loss problem. However, due to the uncertainty of the beginning and ending states, the calculation of tail biting codes can be very complex. Thus, various sub-optimum decoders have been proposed for tail biting codes, where the decoder performance is compromised to avoid high computational complexity.

As such, what is needed is a sub-optimum decoding scheme that properly balances the decoder performance and computational complexity for tail-biting convolution codes.

SUMMARY

This invention discloses a method for decoding tail-biting convolutional codes. In one embodiment of the present invention, the method includes the following steps. All beginning states of a trellis diagram are initialized. Forward Viterbi metrics are calculated for the trellis diagram. A trace-back process is performed from an ending state of the trellis diagram at a first time instance to a first state where all surviving paths converge at a second time instance. Backward Viterbi metrics are calculated for a predetermined period of time from the first state at the second time instance to a second state at a third time instance. A trace-back process is performed from a designated state, which is equal to the second state, at the first time instance to determine a most likely path for the convolutional codes in the trellis diagram.

The construction and method of operation of the invention, however, together with additional objectives and advantages thereof will be best understood from the following description of specific embodiments when read in connection with the accompanying drawings.

DESCRIPTION

Figure 1:
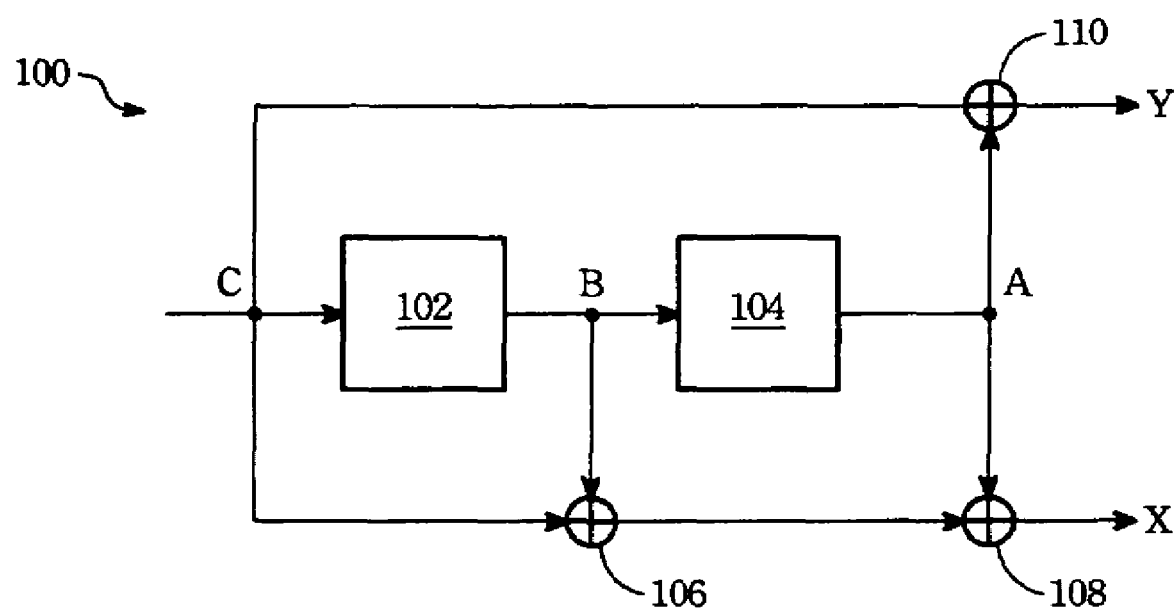
FIG. 1 illustrates a conventional convolutional encoder.
Figure 2:
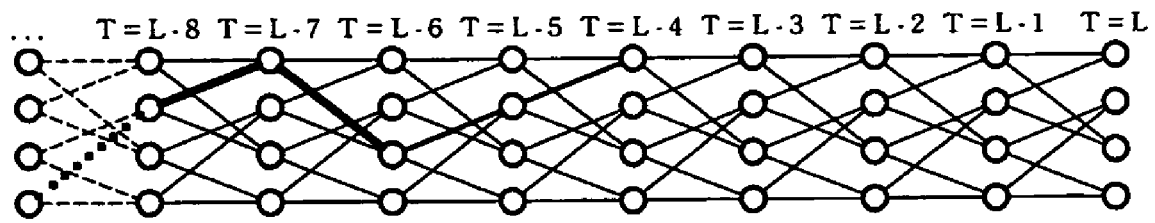
FIG. 2 illustrates surviving paths of a trellis diagram based on the Viterbi algorithm in accordance with one embodiment of the present invention.

FIG. 2 illustrates forward surviving paths of a trellis diagram based on the Viterbi algorithm in accordance with one embodiment of the present invention. For each time instance, there are four nodes representing the four possible combinations of the logic states, 00, 01, 10 and 11, at nodes A and B shown in FIG. 1. The input at node C (see, FIG. 1) at a time instance determines the logic states of nodes A and B at the next time instance. This trellis diagram represents an encoding process from time t=L−8 to time t=L. The links among the nodes represent changes of the logic states at nodes A and B, and can be used to decode the convolutional codes to obtain the bit stream received at node C.

Viterbi algorithm is a decoding scheme that explores all possible paths through the trellis, but only selects the best path. In the Viterbi algorithm, the surviving paths are the paths with the highest probability passing through a state at any given time instance. There may be various possible surviving paths at a given time instance. However, as the surviving paths advance further from the boundary of a trellis, it is very likely that they converge into a single path. FIG. 2 shows this effect at t=L−8 where L indicates the length of the trellis. The bolder surviving paths in the figure indicate the convergence of two or more surviving paths. The number of trellis section required for convergence of surviving paths is known to be 5V, where V is known as a constraint length, which is equal to the number of memory cells of the convolutional code plus one. Convergence of all surviving paths indicates that the coded sequence indeed passes through a particular state at particular time. Thus, the states that the coded sequence passes through can be calculated with a high probability by observing the convergence of surviving paths. This knowledge is very useful in decoding the tail-biting convolution codes since their starting and ending states are usually unknown, even though the starting and ending states are set to be the same.

Figure 3:
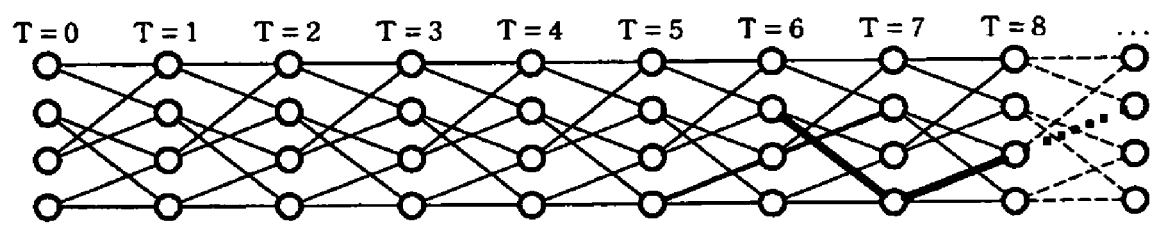
FIG. 3 illustrates surviving paths of a trellis diagram based on the Viterbi algorithm in accordance with another embodiment of the present invention.

FIG. 3 illustrates surviving paths of a trellis diagram based on the Viterbi algorithm in accordance with another embodiment of the present invention. The Viterbi algorithm can be applied to trace back the surviving paths to the initial time instance t=0. At t=0, there are various possible surviving paths. Similar to the trellis diagram shown in FIG. 2, the surviving paths associated with each state are likely to converge at some point in time.

Figure 4:
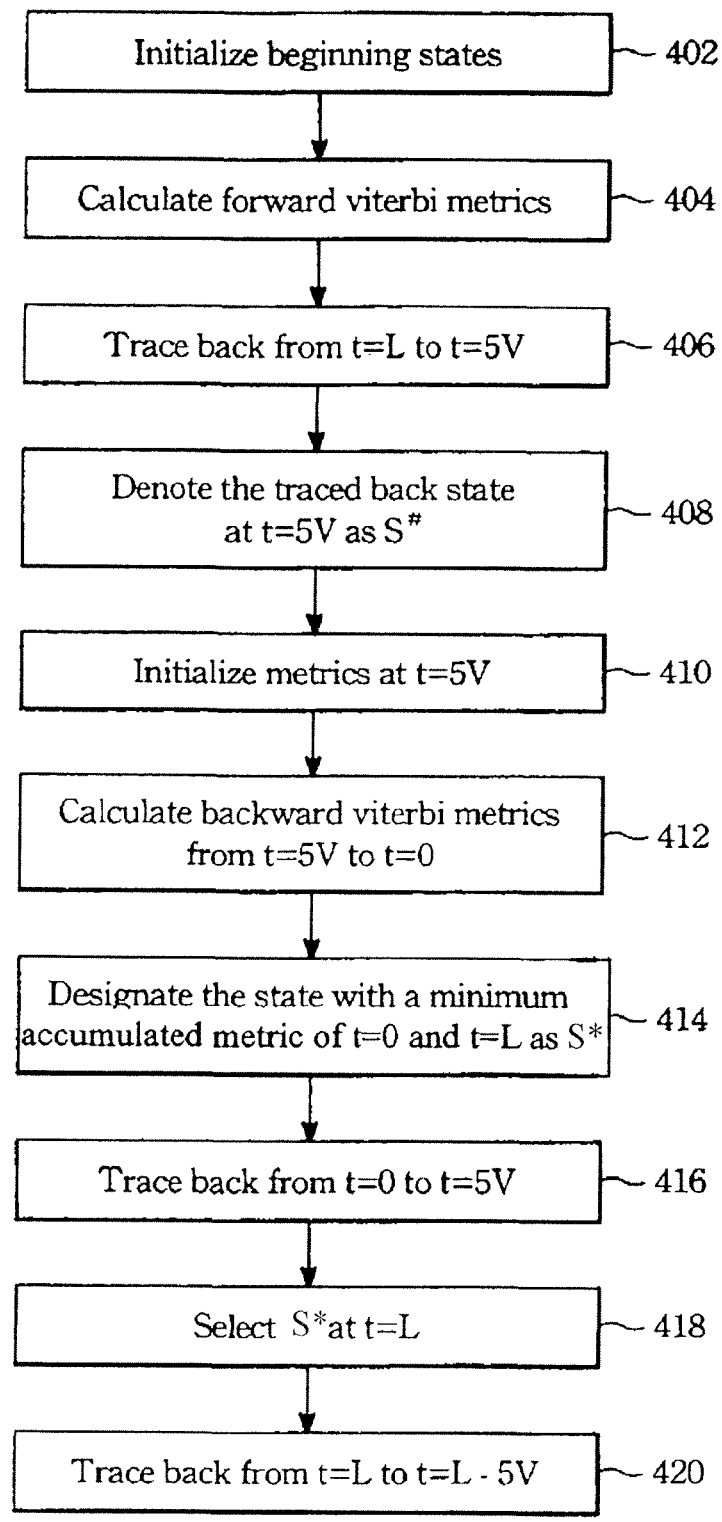
FIG. 4 is a flowchart showing a method for decoding tail-biting convolutional codes in accordance with one embodiment of the present invention.

FIG. 4 is a flowchart showing a method for decoding tail-biting convolutional codes in accordance with one embodiment of the present invention. As discussed above, tail biting is a scheme used to terminate the trellis of convolutional codes by designating the same value to the beginning and ending states. Since tail biting does not require any additional bits, it does not have the rate loss problem. However, due to the uncertainty of the beginning and ending states, the calculation of tail biting codes can be very complex. Thus, the embodiment of the present invention proposes a sub-optimum method for decoding the tail-biting codes in a fashion that balances the decoding performance and complexity of calculation.

Figure 5A:
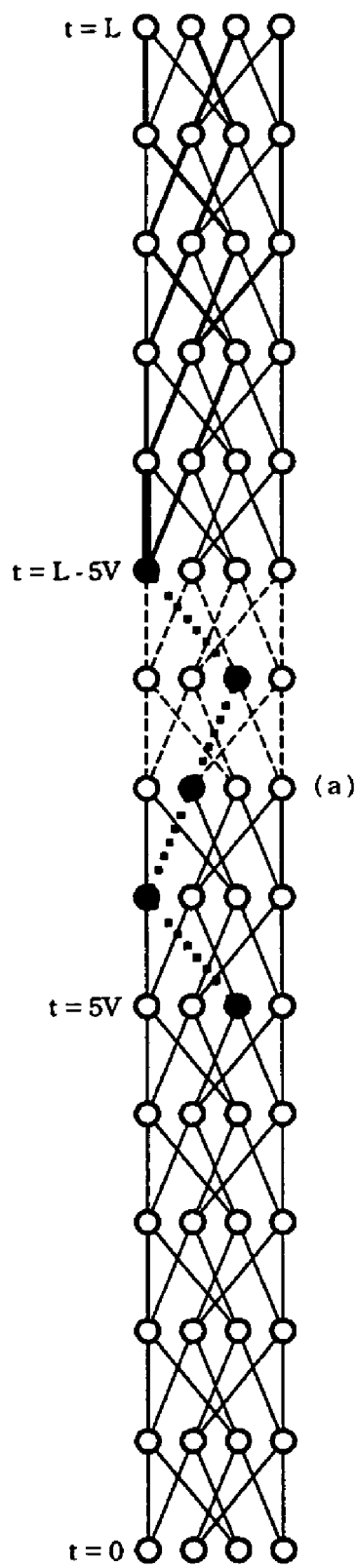
FIGS. 5A-5D illustrate a number of trellis diagrams for explaining the proposed method in accordance with one embodiment of the present invention.

At step 402, all the beginning states of the trellis diagram are initialized with equal probability by, for example, assigning zeros to all the metrics of the beginning states. At step 404, forward Viterbi metrics are calculated for a set of symbols received by the convolutional encoder. At step 406, the Viterbi metrics are traced back from any ending state at t=L to t=5V. As shown in the trellis diagram of FIG. 5A, the state at t=5V is not only shared with all the surviving paths of the forward Viterbi algorithm but also all the surviving paths of the backward Viterbi algorithm. This state is denoted as S# at step 408.

Figure 5B:
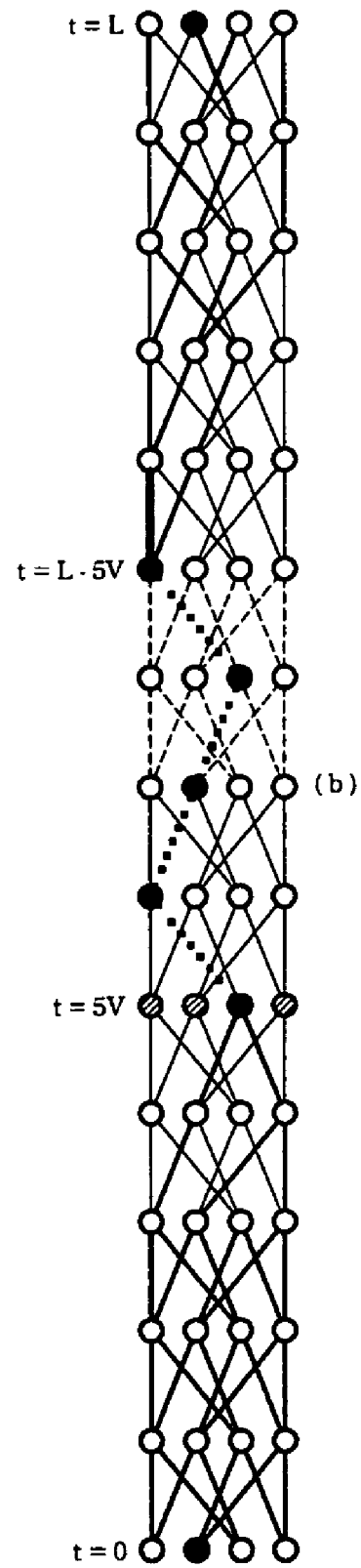
Figure 5C:
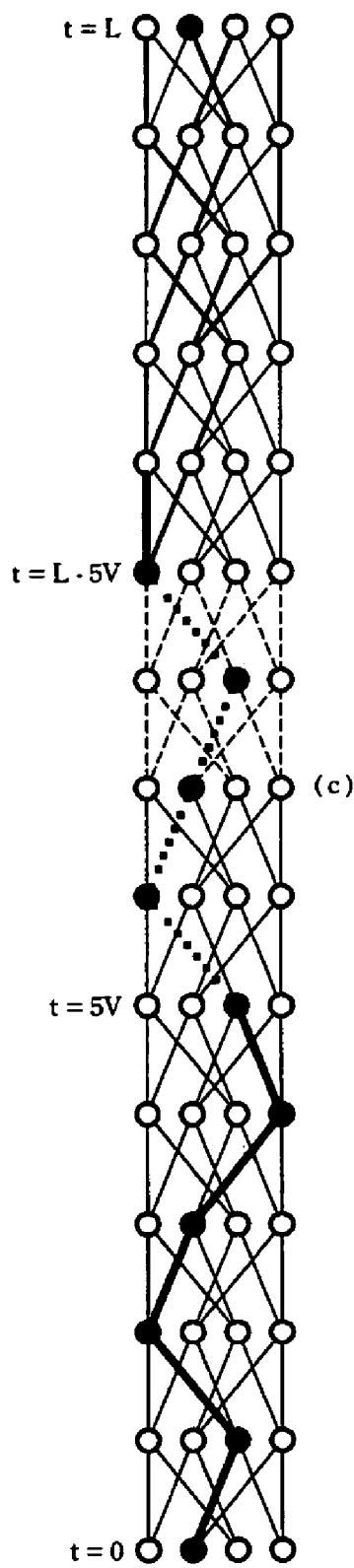
Figure 5D:
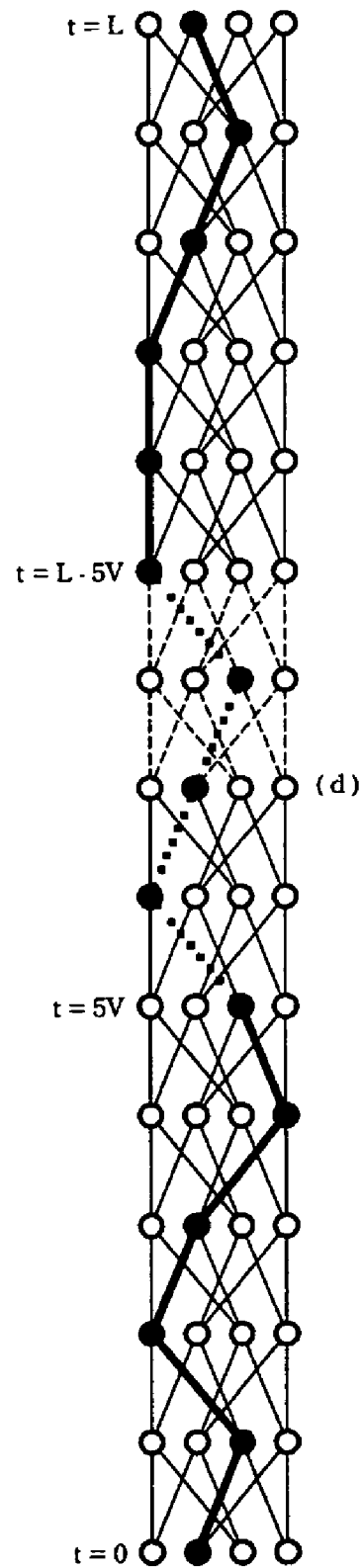

At step 410, the metrics at t=5V are initialized. The metric of state $S^{\#}$ is set to zero, and the metrics of all other states are set to maximum values. As shown in FIG. 5B, the state $S^{\#}$ is drawn as a dark node, and the other states are drawn as shaded nodes. At step 412, backward Viterbi metrics are calculated from t=5V to t=0, as shown in FIG. 5B. At step 414, the accumulated metrics of the states at t=L and the metrics of the states at t=0 are calculated. The state that has the minimum accumulated metric of t=0 and t=L is denoted as S*, which is shown as the dark node in FIG. 5B at t=0 and t=L. This state is very likely to be the actual starting and ending states. At step 416, the forward Viterbi metrics are calculated from t=0 to t=5V, using S* as the initial state. At step 418, the state S*, obtained at step 414, is selected at t=L, which is shown as a dark node in FIG. 5C. At step 420, the Viterbi metrics are traced back from t=L to t=L−5V, as shown in FIG. 5D.

Throughout the proposed method, the size 5V has been repeated as a length where the surviving path would converge with high probability. Depending on the operating signal-to-noise ratio or on the desired tradeoff between the additional complexity and the performance, however, it is practical to change the size 5V to slightly smaller or larger sizes (e.g. 3V or 7V). Applying such change might be through some tuning process in simulation or test phase. For example, the result of initial tuning might lead to changing 5V at step 406 of FIG. 4 to 7V, and the 5V at step 420 to 3V.

The proposed embodiment of the present invention takes advantage of the metric behavior of the Viterbi algorithm and the properties of the surviving paths. The invention uses the knowledge of state sequence that is hidden in the surviving paths. The proposed method only requires the additional calculation of backward Viterbi algorithm for a period of 5V at the beginning of the trellis and a partial trace back repetition at the end of the trellis to determine the correct sequence.

The proposed method avoids the complex calculation for the hope of convergence of the metrics as the conventional methods often teach. Thus, the proposed sub-optimum method can decode the tail-biting codes in a fashion that balances the decoding performance and complexity of calculation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method executed by a decoder of a receiver device for decoding tail-biting convolutional codes, comprising:
  receiving at the receiver device a signal comprising a bit sequence encoded with a tail-biting convolutional code;
  initializing memory for all beginning states of a trellis used by the decoder when decoding the received bit sequence;
  calculating forward Viterbi metrics for the states of the trellis based on the received bit sequence;
  tracing back from an ending state of the trellis at a first time instance to a first state where the state of all forward and backward surviving paths is shared at a second time instance;
  calculating backward Viterbi metrics for a predetermined period of time from the first state at the second time instance to a second state at a third time instance; and
  tracing back from the second state at the third time instance to the first state at the second time instance to determine a most likely path for the convolutional codes in the trellis.

2. The method of claim 1, wherein initializing all beginning states comprises setting all the beginning states to zero.

3. The method of claim 1, wherein the second time instance is equal to three, five, or seven times a constraint length.

4. The method of claim 3, wherein the third time instance is equal to zero, and the predetermined period of time is equal to three, five, or seven times the constraint length.

5. The method of claim 1, further comprising setting the first state to zero before calculating the backward Viterbi metrics.

6. The method of claim 5, further comprising setting other states at the second time instance to maximum values before calculating the backward Viterbi metrics.

7. The method of claim 1, further comprising calculating accumulated Viterbi metrics for the ending and second states.

8. The method of claim 7, further comprising determining which of either the ending state or the second state has a minimum accumulated metric prior to tracing back from the second state.

9. The method of claim 1, further comprising tracing back from the ending state at the first time instance to the first state at the second time instance.

10. A method executed by a decoder of a receiver device for decoding tail-biting convolutional codes, comprising:

receiving at the receiver device a signal comprising a bit sequence encoded with a tail-biting convolutional code;

initializing memory for all beginning states of a trellis used by the decoder when decoding the received bit sequence;

calculating forward Viterbi metrics for the states of the trellis;

tracing back from an ending state of the trellis at a first time instance to a first state where all surviving paths converge at a second time instance;

setting the first state to zero and other states at the second time instance to maximum values;

calculating backward Viterbi metrics for a predetermined period of time from the first state at the second time instance to a second state at a third time instance; and tracing back from the second state at the third time instance to the first state at the second time instance to determine a most likely path for the convolutional codes in the trellis.

11. The method of claim 10, wherein initializing all beginning states comprises setting all the beginning states to zero.

12. The method of claim 10, wherein the second time instance is equal to three, five, or seven times a constraint length.

13. The method of claim 12, wherein the third time instance is equal to zero, and the predetermined period of time is equal to three, five, or seven times the constraint length.

14. The method of claim 10, further comprising calculating accumulated Viterbi metrics for the ending and second states.

15. The method of claim 14, further comprising determining which of either the ending state or the second state has a minimum accumulated metric prior to tracing back from the second state.

16. A method executed by a decoder of a receiver device for decoding tail-biting convolutional codes, comprising:

receiving at the receiver device a signal comprising a bit sequence encoded with a tail-biting convolutional code;

initializing memory for all beginning states of a trellis used by the decoder when decoding the received bit sequence;

calculating forward Viterbi metrics for the states of the trellis;

tracing back from an ending state of the trellis at a first time instance to a first state where all surviving paths converge at a second time instance;

setting the first state to zero and other states at the second time instance to maximum values;

calculating backward Viterbi metrics from the first state at the second time instance to a second state at a third time instance, wherein the second and third time instances have a time interval of a multiple of a constraint length; and tracing back from the second state at the third time instance to the first state at the second time instance to determine a most likely path for the convolutional codes in the trellis.

17. The method of claim 16, wherein initializing all beginning states comprises setting all the beginning states to zero.

18. The method of claim 16, wherein the second time instance is equal to three, five, or seven times the constraint length, and the third time instance is equal to zero.

19. The method of claim 16, further comprising calculating accumulated Viterbi metrics for the ending and second states.

20. The method of claim 19, further comprising determining which of either the ending state or the second state has a minimum accumulated metric prior to tracing back from the second state.

* * * * *

UNITED STATES PATENT AND TRADEMARK OFFICE
CERTIFICATE OF CORRECTION

PATENT NO.       : 7,640,478 B2                                      Page 1 of 1
APPLICATION NO.  : 11/408471
DATED            : December 29, 2009
INVENTOR(S)      : Hedayat et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 910 days.

Signed and Sealed this

Twenty-first Day of December, 2010

David J. Kappos
*Director of the United States Patent and Trademark Office*